(12) United States Patent
Druault

(10) Patent No.: US 10,320,435 B2
(45) Date of Patent: Jun. 11, 2019

(54) REMOTE-CONTROL DEVICE FOR A MOTOR VEHICLE

(71) Applicant: VALEO COMFORT AND DRIVING ASSISTANCE, Creteil (FR)

(72) Inventor: Eric Druault, Créteil (FR)

(73) Assignee: VALEO COMFORT AND DRIVING ASSISTANCE, Créteil (FR)

( * ) Notice: Subject to any disclaimer, the term of this patent is extended or adjusted under 35 U.S.C. 154(b) by 233 days.

(21) Appl. No.: 15/102,916

(22) PCT Filed: Dec. 10, 2014

(86) PCT No.: PCT/EP2014/077239
§ 371 (c)(1),
(2) Date: Jun. 9, 2016

(87) PCT Pub. No.: WO2015/086685
PCT Pub. Date: Jun. 18, 2015

(65) Prior Publication Data
US 2016/0308567 A1    Oct. 20, 2016

(30) Foreign Application Priority Data

Dec. 11, 2013   (FR) ...................................... 13 02910

(51) Int. Cl.
*H02J 1/10* (2006.01)
*H02J 3/00* (2006.01)
(Continued)

(52) U.S. Cl.
CPC ......... *H04B 1/3833* (2013.01); *H04B 1/0346* (2013.01); *H04B 15/02* (2013.01); *H05K 5/0086* (2013.01); *H04B 2215/063* (2013.01)

(58) Field of Classification Search
CPC .... H04B 1/0346; H04B 1/3833; H04B 15/02; H04B 2215/063; H05K 5/0086
(Continued)

(56) References Cited

U.S. PATENT DOCUMENTS 6,628,107 B1 *  9/2003  Bang ......................... G06F 1/30
                                                             323/266
6,965,295 B2 * 11/2005  Shimonomoto ...... B60R 25/246
                                                             340/10.34
(Continued)

FOREIGN PATENT DOCUMENTS

CN           2 565 188 Y       8/2003

OTHER PUBLICATIONS

International Search Report issued in PCT/EP2014/077239 dated Feb. 23, 2015 (2 pages).
(Continued)

*Primary Examiner* — Rexford N Barnie
*Assistant Examiner* — Toan T Vu
(74) *Attorney, Agent, or Firm* — Osha Liang LLP

(57) ABSTRACT

An electronic assembly for a remote-control device for a motor vehicle includes an electric power source and a supercapacitor block. The supercapacitor block has one or more supercapacitors, and said supercapacitor block is arranged in parallel with the electric power source. Additionally, a transmitter/receiver is connected to the supercapacitor block and a frequency amplifier stage is connected to said transmitter/receiver.

7 Claims, 1 Drawing Sheet

(51) Int. Cl.
*H04B 1/3827* (2015.01)
*H04B 1/034* (2006.01)
*H04B 15/02* (2006.01)
*H05K 5/00* (2006.01)

(58) Field of Classification Search
USPC .......................................................... 307/52
See application file for complete search history.

(56) References Cited

U.S. PATENT DOCUMENTS

| | | | | |
|---|---|---|---|---|
| 2007/0298736 | A1* | 12/2007 | Fujioka | H03F 1/0266 455/127.3 |
| 2008/0280568 | A1* | 11/2008 | Kielb | G01D 21/00 455/74.1 |
| 2008/0315829 | A1* | 12/2008 | Jones | H02J 7/345 320/103 |
| 2014/0038672 | A1* | 2/2014 | Yang | H04M 19/08 455/558 |

OTHER PUBLICATIONS

Written Opinion of the International Searching Authority issued in PCT/EP2014/077239 dated Feb. 23, 2015 (6 pages).

* cited by examiner

REMOTE-CONTROL DEVICE FOR A MOTOR VEHICLE

TECHNICAL FIELD OF THE INVENTION

The present invention concerns an electronic assembly for a remote-control device for a motor vehicle.

It finds one particular but nonlimiting application in the field of remote-control devices.

TECHNOLOGICAL BACKGROUND OF THE INVENTION

In the field of remote control of a motor vehicle, a remote-control device enables execution of a basic function such as remote locking/unlocking of the motor vehicle with a range of the order of approximately 50 meters. However, more sophisticated functions are now executed via said remote-control device, such as comfort functions (remote pre-warming of the vehicle) or functions that display the status of the vehicle on a screen of the remote-control device. These functions necessitate long-range communication. To this end, the electronic assembly for the remote-control device includes a transmitter/receiver and a frequency amplifier that enable communication to be established between said remote-control device and the motor vehicle and thus a range of the order of 500 meters to be obtained. Moreover, the electronic assembly includes an electric power source (button cell) to power all of these electronic components. The button cell delivers a voltage of the order of 3 V. The advantage of a button cell is that it is of small overall size compared to a stick cell, which is of interest for the remote-control device, in which space is limited.

However, a disadvantage of this prior art resides in the fact that the frequency amplifier draws a high current, of the order of 100 mA, when it is communicating with the motor vehicle and notably on each radio-frequency transmission. The button cell, which has an internal resistance, suffers a voltage drop that is very large, of the order of 1 V, when the high current necessary for the frequency amplifier flows. Consequently, the button cell is discharged very rapidly and therefore supplies only 2 V. This excessively rapid discharge and this high voltage drop therefore lead to malfunctions of the remote-control device including said electronic assembly such as a falling below an operating voltage and consequently a reduction of the communication range of said remote-control device or even its reinitialization with loss of information. It will be noted that the limit operating voltage of such a remote-control device is around 2 V.

In this context, the present invention aims to resolve the disadvantage referred to above.

GENERAL DESCRIPTION OF THE INVENTION

To this end the invention proposes an electronic assembly for a remote-control device for a motor vehicle in which said electronic assembly includes:
  an electric power source;
  a supercapacitor block, said supercapacitor block being arranged in parallel with the electric power source;
  a transmitter/receiver connected to said supercapacitor block; and
  a frequency amplifier stage connected to said transmitter/receiver.

Accordingly, as will emerge in detail later, it is the supercapacitor block that will be discharged instead of the electric power source at the time of a radio-frequency transmission by the transmitter/receiver, for example, to supply the electric power necessary for said transmission, which will make it possible to mask the internal resistance of the electric power source. There is therefore no longer any voltage drop at the terminals of the latter.

In nonlimiting embodiments, the electronic assembly may also have one or more of the following additional features:
  said electronic assembly includes a protection block for the supercapacitor block to limit a demand for current from the supercapacitor block to the electric power source,
  the supercapacitor block has a value greater than or equal to ten millifarads,
  the supercapacitor block has a value greater than or equal to one hundred and fifty millifarads,
  the supercapacitor block includes a single supercapacitor having a value of two hundred and twenty millifarads.

There is also proposed a remote-control device for a motor vehicle wherein said remote-control device includes the electronic assembly having any one of the above features, a user control device and an antenna.

BRIEF DESCRIPTION OF THE FIGURES

The invention and its various applications will be better understood after reading the following description and examining the figures that accompany it.

DESCRIPTION OF EMBODIMENTS OF THE INVENTION

Elements that are identical in terms of structure or function appearing in different figures retain the same references unless otherwise indicated.

The electronic assembly 1 for a remote-control device 2 is described with reference to FIG. 1.

Figure 1:
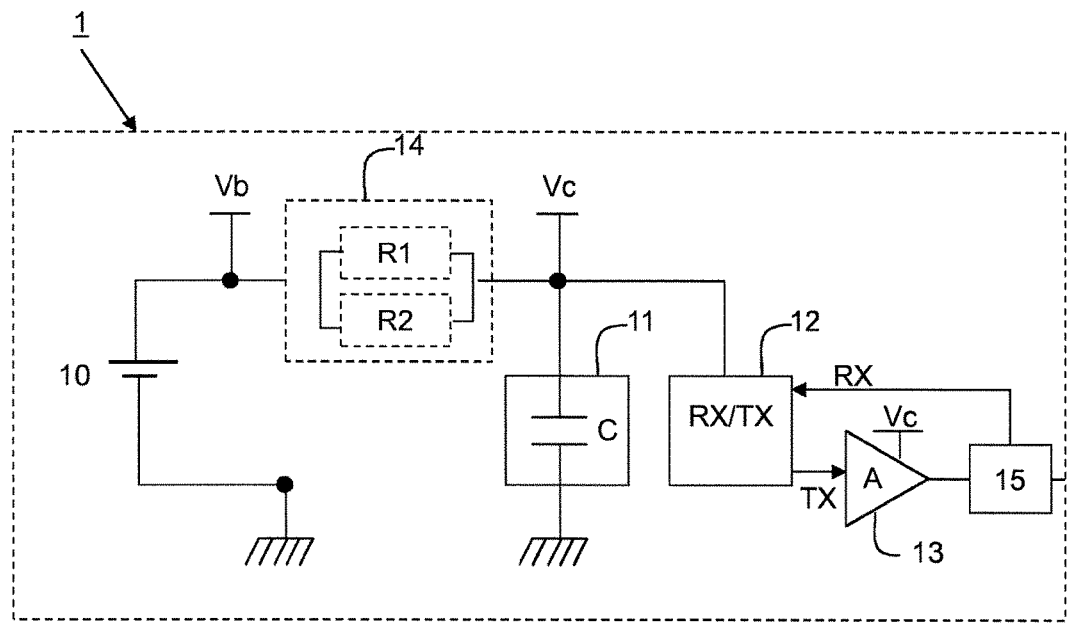
FIG. 1 represents a schematic of an electronic assembly for a remote-control device in accordance with the invention.

As shown in FIG. 1, in accordance with one nonlimiting embodiment, the electronic assembly 1 includes:
  an electric power source 10;
  a supercapacitor block 11, said supercapacitor block 11 being arranged in parallel with the electric power source 10;
  a transmitter/receiver 12 connected to said supercapacitor block 11; and
  a frequency amplifier stage 13 connected to said transmitter/receiver 12.

In one nonlimiting example the electric power source 10 is a button cell. In one nonlimiting example the electric power source 10 supplies a voltage Vb of 3 V and has an internal resistance of approximately 10Ω for an outside temperature of 25° C. and approximately 50Ω at −20° C.

In the remainder of the description, the nonlimiting example of the button cell will be adopted.

The button cell 10 is connected on the upstream side of the supercapacitor block 11. It will make it possible to charge said block 11.

The supercapacitor block 11 includes one or more supercapacitors C. In one nonlimiting embodiment shown in FIG. 1 the supercapacitor block 11 includes a single supercapacitor C. The fact of having a single supercapacitor C makes it possible to reduce the space used. In one nonlimiting embodiment, the capacitance of this supercapacitor is of the order of one hundred millifarads to make it possible, on the one hand, to deliver a high supply current of the order of 100 mA to the electronic assembly 1 and, on the other hand, to have a supercapacitor block 11 small enough to be inserted into the small space of the remote-control device 2. This order of magnitude of about one hundred mF also prevents excessively rapid discharging of the supercapacitor C. Supercapacitors with a capacitance of this order have an internal resistance of the order of 0.1Ω.

Accordingly, in one nonlimiting embodiment, the capacitance of the supercapacitor C (or of the supercapacitors taken together) is greater than or equal to 150 mF. This lower limit value makes it possible to take into account a particular communication protocol used between the remote-control device 2 and the motor vehicle V (notably the transmission time of radio-frequency (RF) frames, the transmission repetition period), and the autonomy of the remote-control device 2. This particular protocol is used for remote controls such as, in one nonlimiting example, the display of the status of the motor vehicle V. The features of the particular communication protocol described in one nonlimiting example are as follows.

The radio-frequency frame transmission time is between 26 ms and 55 ms while the radio-frequency frame reception time is between 40 ms and 140 ms. Where the repetition of transmissions is concerned, the time between the first two RF transmissions is 75 ms; the time between the second and third transmissions is 45 ms.

This sequence (three RF transmissions spaced by 75 ms and 45 ms) is repeated several times in the application as a function of the commands of the user.

The autonomy of the device 2 is two years in a profile of use defined in temperature (15% of the time at 60° C., 75% of the time at 25° C. and 10% of the time at −10° C.) It will be noted that the shorter the transmission of a frame, the lower the energy requirement and the more the value of the supercapacitors may be reduced. Accordingly, for some communication protocols with shorter frames, there may be a lower limit value of 10 mF for the supercapacitor C of the block 11 (or the supercapacitors C of the block 11 taken together). Moreover, it will be noted that the upper limit value of the supercapacitor C (or the supercapacitors taken together) is notably determined by the space available in the remote-control device 2.

In one nonlimiting example, the value of the supercapacitor C is 220 mF and its size is of the order of 2 cm by 1 cm. It can withstand limit currents of the order of 10 A.

The transmitter/receiver 12 is connected on the downstream side to the supercapacitor block 11 and on the upstream side to the amplifier block 12. The supercapacitor block 11 therefore makes it possible to supply the transmitter/receiver 12 with electric power.

Figure 2:
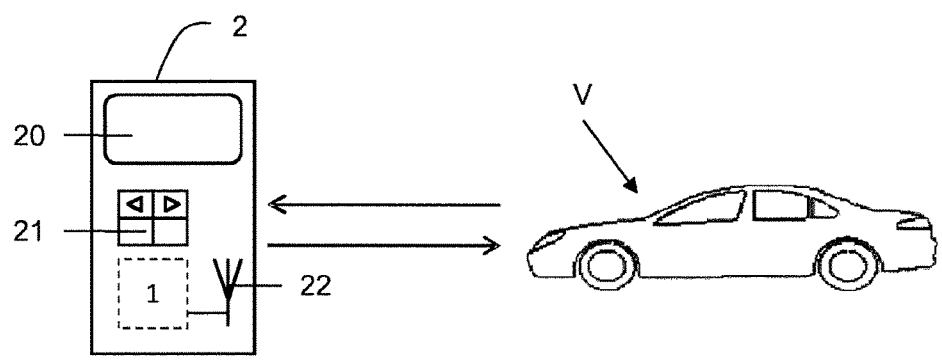
FIG. 2 represents a schematic of the remote-control device adapted to communicate with a motor vehicle, said remote-control device including the electronic assembly from FIG. 1.

The remote-control device 2 (or hands-free system) is represented in FIG. 2. In one nonlimiting embodiment it includes:
- a screen 20 for displaying information notably emanating from the motor vehicle V;
- a user control device 21;
- the electronic assembly 1; and
- an antenna 22.

When a user launches a command, in one nonlimiting example a command to pre-warm the motor vehicle V or a command to display the status of the motor vehicle V, they do so from the user control device 21 of the remote-control device 2. At this moment, a protocol is triggered governing communication between the remote-control device 2 and the motor vehicle V. This communication protocol involves the transmission of a plurality of radio-frequency (RF) frames from the remote-control device 2 and the reception said device 2 of a plurality of RF frames by, frames emanating from the motor vehicle V (more particularly from a transmitter/receiver of said vehicle).

This transmission/reception is effected by means of the transmitter/receiver 12 and the frequency amplifier stage 13, which makes it possible to increase the RF transmission power and therefore to send a command via the antenna 22 over a distance of approximately 500 meters relative to the vehicle V. A switch 15 connected on the downstream side of the amplifier stage 13 and on the upstream side of the antenna 22 makes it possible to set said antenna 22 to receive mode or to transmit mode. In one nonlimiting example, the antenna 22 transmits at around 434 MHz.

The transmission of a series of RF frames (known as a burst) necessitates a power supply current of the order of 100 mA because the amplifier stage 13 necessitates the use of a high current. A high current of this order therefore enables long-distance RF transmission.

On transmission of a series of RF frames, the supercapacitor block 11 is discharged in order to supply the current (100 mA) necessary for said transmission to the transmitter/receiver 12 and to the amplifier stage 13.

There is a voltage drop because of the internal resistance of the supercapacitor C, but this voltage drop is very small (of the order of 100 mV) compared to the voltage Vb (3 V) of the electronic assembly 1. The button cell 10 itself no longer suffers any voltage drop with the result that it no longer degrades the voltage Vb.

Accordingly, thanks to the supercapacitor block 11, the negative effect of the button cell 10 is masked. The internal resistance of the button cell 10 is circumvented. In other words, a voltage drop that can be from 1 V (at 25° C.) to 3 V when the cell is cold (at −20° C.) is therefore circumvented. The effect of ageing of the button cell 10, the internal resistance of which increases with age, is also circumvented.

The remote-control device 2 can function for a few seconds without the button cell because it is now the supercapacitor block 11 that supplies the electric power necessary for it to function.

Accordingly, in the situation where there exists a loss of contact with the button cell, which can occur for example if the user inadvertently drops the remote-control device 2, the electronic assembly 1 does not see any microinterruption of voltage. There is therefore no reinitialization of the remote-control device 2. Consequently, there is no loss of information on writing information into a rewritable memory of the device 2, said information being supplied to the user of the vehicle V.

It will be noted that the RF transmission time determines the electric power consumed. The longer the exchanges between the remote-control device 2 and the vehicle, the longer the duration of the demand for power supply current, and consequently the longer the duration of the discharging of the supercapacitor C of the block 11 to supply that current demand.

The supercapacitor block 11 is therefore dimensioned, on the one hand, so that the supercapacitor or capacitors is or are not discharged too rapidly and, on the other hand, to address the dimensional constraint of the remote-control device 2 which cannot include either a supercapacitor of large size or an RF antenna 22 of large size.

At the same time as the supercapacitor C is discharging, the button cell 10 that is connected in parallel with the supercapacitor C charges the supercapacitor C to its own voltage, namely 3 V (when the button cell is charged to the maximum) until the voltages are balanced between said button cell 10 and the supercapacitor block 11.

It must be remembered that the button cell 10 charges more slowly than the supercapacitor C discharges and that the voltage at the terminals of the button cell decreases as said cell ages.

The button cell 10 therefore compensates for the discharging of the supercapacitor block 11, for example a voltage drop caused by a demand for electric power generated by sending a remote command to the motor vehicle V.

This charging by the button cell 10 is therefore cyclic because it is executed each time that there exists a demand for electric power for a transmission of a series of RF frames.

It will be noted that on starting up or initializing the remote-control device 2 the same communication protocol is used to feed back to the user on the screen 20 of the remote-control device 2 notably the status of the vehicle V and the same phenomenon of discharging of the supercapacitor C/charging by the electric power source 10 is operative. In these nonlimiting examples the status of the vehicle includes:
an indicator to indicate if the air conditioning is on/off;
preprogrammed timers to turn on/turn off the air conditioning;
the date;
an indicator to indicate to the user that they must fill up; and
an indicator of the charge of the battery of the motor vehicle V.

Other information can also be indicated on the screen of the remote-control device 2, such as, in one nonlimiting example, the information that the vehicle is situated within the communication range of the device 2.

In one nonlimiting embodiment as shown in FIG. 1, the electronic assembly 1 further includes a protection block 14 (represented in dashed line) for the supercapacitor block 11 to limit a demand for electric power from the supercapacitor 11 to the button cell 10. It will be noted that in this case the usable voltage for supplying power to the electronic assembly 1 is the voltage Vc indicated in FIG. 1 (rather than Vb in the situation where there is no protection block 14).

In one nonlimiting example, said block 14 includes two resistances R1 and R2 in parallel. This makes it possible to employ low resistances that withstand discharge currents of the order of 1 to 3 A and take up less room than a single resistance. In one nonlimiting example, the resistances R1 and R2 are equal to 2.7Ω.

This protection block 14 makes it possible to limit a demand for electric power from the supercapacitor block 11 to the button cell 10 if the polarities of the button cell 10 are reversed. This can happen when the user changes the button cell 10 and the user makes a mistake and inverts the contacts of the cell.

In fact, if the polarities are reversed, the same potential is applied to the two contacts of the button cell 10, creating a short-circuit. If the supercapacitor C is charged to 3 V, it is discharged immediately and its potential therefore returns to 0 V (in the case of a mechanical design of a button cell that imposes the same potential on inversion). It will be noted that in other cases the potential is −3 V instead of 0 V.

This instantaneous discharge leads to a current demand greater than 10 A with the risk of damaging the supercapacitor C (the limit current that the supercapacitor C can withstand being of the order of 10 A) or at the very least to cause it to age too rapidly.

Thanks to the protection block 14, the current demand is limited to 3 A because the resistances R1, R2 limit the rate of discharge from the supercapacitor C to the button cell 10 when the supercapacitor block 11 is charged to 3 V. The supercapacitor C is therefore protected against damage and/or ageing and in fact there is no risk of the value of the supercapacitor decreasing. There is no risk of reduction of energy reserve and therefore there is no risk of the remote-control device 2 being less effective (reduction of its communication range) or stopping working.

Of course, the description of the invention is not limited to the application, the embodiments and the examples described above.

Accordingly, in another nonlimiting embodiment, the electronic assembly 1 includes said antenna 22.

Accordingly, said antenna 22 can transmit at other frequencies, such as in frequency bands around 315 MHz (used in Japan and the United States), for example, or around 868 MHz or 915 MHz (used in Europe and the United States).

Accordingly, the invention described notably has the following advantages:
it enables the autonomy of the remote-control device to be increased by circumventing ageing of the electric power source 10 and the problem of the cell when cold (problem of low temperatures);
it makes it possible for the electronic assembly 1 to be of smaller size through using one or more supercapacitors;
it makes it possible to avoid dropping below a working voltage of the remote-control device 2;
it makes it possible not to degrade the performance (autonomy, communication range) of the remote-control device 2;
it makes it possible to prevent damage to the supercapacitor 11 thanks to the use of the protection block 14 that is adapted to limit a current demand.

The invention claimed is:

1. An electronic assembly for a remote-control device for a motor vehicle in which said electronic assembly comprises:
an electric power source;
a supercapacitor block, said supercapacitor block being arranged in parallel with the electric power source;
a protection block for the supercapacitor block to limit a demand for current from said supercapacitor block to the electric power source, wherein said protection block is connected in series with the electric power source, and wherein the protection block includes two resistances in parallel;
a transmitter/receiver connected to said supercapacitor block; and
a frequency amplifier stage connected to said transmitter/receiver.

2. The electronic assembly as claimed in claim 1, wherein the supercapacitor block has a value greater than or equal to ten millifarads.

3. The electronic assembly as claimed in claim 1, wherein the supercapacitor block has a value greater than or equal to one hundred and fifty millifarads.

4. The electronic assembly as claimed in claim 1, wherein the supercapacitor block includes a single supercapacitor having a value of two hundred and twenty millifarads.

5. A remote-control device for a motor vehicle, wherein said remote-control device comprises:
a user control device;

an antenna;
an electronic assembly, wherein the electronic assembly comprises:
   an electric power source,
   a supercapacitor block, said supercapacitor block being arranged in parallel with the electric power source,
   a protection block for the supercapacitor block to limit a demand for current from said supercapacitor block to the electric power source, wherein said protection block is connected in series with the electric power source,
   a transmitter/receiver connected to said supercapacitor block, and
   a frequency amplifier stage connected to said transmitter/receiver; and
a switch connected on a downstream side of the frequency amplifier stage and on an upstream side of the antenna to set said antenna to receive mode or transmit mode.

6. The remote-control device as claimed in claim 5, further comprising a screen configured displaying information emanating from the motor vehicle.

7. The remote-control device as claimed in claim 6, wherein a communication between the motor vehicle and the remote-control device comprises a transmission of a plurality of radio-frequency (RF) frames.

* * * * *